United States Patent
Oh et al.

(10) Patent No.: US 9,391,124 B2
(45) Date of Patent: Jul. 12, 2016

(54) ORGANIC LIGHT EMITTING DIODE DISPLAY

(71) Applicant: SAMSUNG DISPLAY CO., LTD., Yongin, Gyeonggi-Do (KR)

(72) Inventors: Il Soo Oh, Seoul (KR); Chang Ho Lee, Gyeonggi-do (KR); Ji Hwan Yoon, Gyeonggi-do (KR); Dae Yup Shin, Gyeonggi-do (KR); Hee Joo Ko, Gyeonggi-do (KR); Se Jin Cho, Seoul (KR); Jin Young Yun, Gyeonggi-do (KR); Bora Lee, Gyeonggi-do (KR); Yeon-Woo Lee, Chungcheongbuk-do (KR); Beom Joon Kim, Seoul (KR); Pyung Eun Jeon, Seoul (KR); Hyun Ju Choi, Seoul (KR); Joong Won Sim, Seoul (KR); In Jae Lee, Busan (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/315,854

(22) Filed: Jun. 26, 2014

(65) Prior Publication Data
US 2015/0008404 A1 Jan. 8, 2015

(30) Foreign Application Priority Data

Jul. 2, 2013 (KR) .................. 10-2013-0077372
Jun. 17, 2014 (KR) .................. 10-2014-0073807

(51) Int. Cl.
*H01L 29/20* (2006.01)
*H01L 33/00* (2010.01)
(Continued)

(52) U.S. Cl.
CPC ........ *H01L 27/3216* (2013.01); *H01L 27/3211* (2013.01); *H01L 51/0059* (2013.01);
(Continued)

(58) Field of Classification Search
CPC ..... H01L 27/28; H01L 27/32; H01L 27/3209; H01L 27/3225; H01L 27/3241; H01L 27/3244; H01L 27/3248; H01L 27/3262
USPC ............. 257/E51.018, E51.022, E51.026, 88, 257/89, 190, 390, 443, E29.151, E51.005, 257/E25.008
See application file for complete search history.

(56) References Cited

U.S. PATENT DOCUMENTS

2002/0011782 A1   1/2002   Lee et al.
2004/0174116 A1   9/2004   Lu et al.
(Continued)

FOREIGN PATENT DOCUMENTS

EP   179862     2/2002
EP   1237208    9/2002
(Continued)

OTHER PUBLICATIONS

Extended European Search Report dated Jun. 29, 2015.
(Continued)

*Primary Examiner* — Mohammad Islam
*Assistant Examiner* — Joannie A Garcia
(74) *Attorney, Agent, or Firm* — F. Chau & Associates, LLC

(57) ABSTRACT

An organic light emitting diode (OLED) display includes a substrate, a thin film transistor disposed on the substrate, a first electrode disposed on the thin film transistor and electrically connected to the thin film transistor, a first auxiliary layer disposed on the first electrode, an emission layer disposed on the first auxiliary layer, an electron transport layer disposed on the emission layer, a first buffer layer disposed on the electron transport layer, and a second electrode disposed on the first buffer layer.

13 Claims, 9 Drawing Sheets

(51) Int. Cl.
*H01L 27/32* (2006.01)
*H01L 51/00* (2006.01)
*H01L 51/50* (2006.01)

(52) U.S. Cl.
CPC ........ *H01L51/0061* (2013.01); *H01L 51/0072* (2013.01); *H01L 51/0073* (2013.01); *H01L 51/0074* (2013.01); *H01L 51/5056* (2013.01); *H01L 51/5072* (2013.01); *H01L 51/5088* (2013.01); *H01L 51/5092* (2013.01); *H01L 51/5096* (2013.01); *H01L 27/3244* (2013.01); *H01L 51/5016* (2013.01)

(56) References Cited

U.S. PATENT DOCUMENTS

| | | |
|---|---|---|
| 2006/0035015 A1 | 2/2006 | Raychaudhuri et al. |
| 2006/0220534 A1 | 10/2006 | Shibanuma et al. |
| 2007/0082226 A1 | 4/2007 | Yu |
| 2007/0099026 A1* | 5/2007 | Lee .................... H01L 51/5036 428/690 |
| 2008/0251768 A1 | 10/2008 | Hsu et al. |
| 2010/0052522 A1 | 3/2010 | Kim et al. |
| 2010/0314644 A1 | 12/2010 | Nishimura et al. |
| 2013/0049024 A1 | 2/2013 | Choi et al. |
| 2014/0159023 A1* | 6/2014 | Matsumoto et al. ............ 257/40 |

FOREIGN PATENT DOCUMENTS

| | | |
|---|---|---|
| EP | 1369938 | 12/2003 |
| EP | 1521316 | 4/2005 |
| EP | 2117062 | 11/2009 |
| EP | 2709183 | 3/2014 |
| KR | 1020080001183 | 1/2006 |
| KR | 100659131 | 12/2006 |
| WO | 2012157211 | 11/2012 |

OTHER PUBLICATIONS

Extended European Search Report dated Feb. 24, 2015, of the corresponding European Patent Application No. 14162166.4
Partial European Search Report dated Mar. 6, 2015, of the corresponding European Patent Application No. 14175115.6.

* cited by examiner

ORGANIC LIGHT EMITTING DIODE DISPLAY

CROSS-REFERENCE TO RELATED APPLICATION

This application claims priority under 35 U.S.C. §119 to Korean Patent Application No. 10-2013-0077372, filed on Jul. 2, 2013 and No. 10-2014-0073807, filed on Jun. 17, 2014 in the Korean Intellectual Property Office, the disclosure of which is incorporated by reference herein in its entirety.

TECHNICAL FIELD

The present invention relates to an organic light emitting diode (OLED) display.

DISCUSSION OF RELATED ART

Organic light emitting diode (OLED) displays are self-emissive using organic light emitting diodes. Holes and electrons are injected into the emission layer, and are recombined in the emission layer to generate excitons, thereby emitting light to display an image.

OLED displays include a pixel electrode and a common electrode to provide holes and electrons, respectively. The common electrode is formed using a sputtering process.

SUMMARY

An exemplary embodiment of the present invention provides an organic light emitting diode (OLED) display includes a substrate, a thin film transistor disposed on the substrate, a first electrode disposed on the thin film transistor and electrically connected to the thin film transistor, a first auxiliary layer disposed on the first electrode, an emission layer disposed on the first auxiliary layer, an electron transport layer disposed on the emission layer, a first buffer layer disposed on the electron transport layer, and a second electrode disposed on the first buffer layer.

BRIEF DESCRIPTION OF THE DRAWINGS

These and other features of the present invention will become more apparent by describing in detail exemplary embodiments thereof with reference to the accompanying drawings of which.

DETAILED DESCRIPTION OF THE EXEMPLARY EMBODIMENTS

Figure 1:
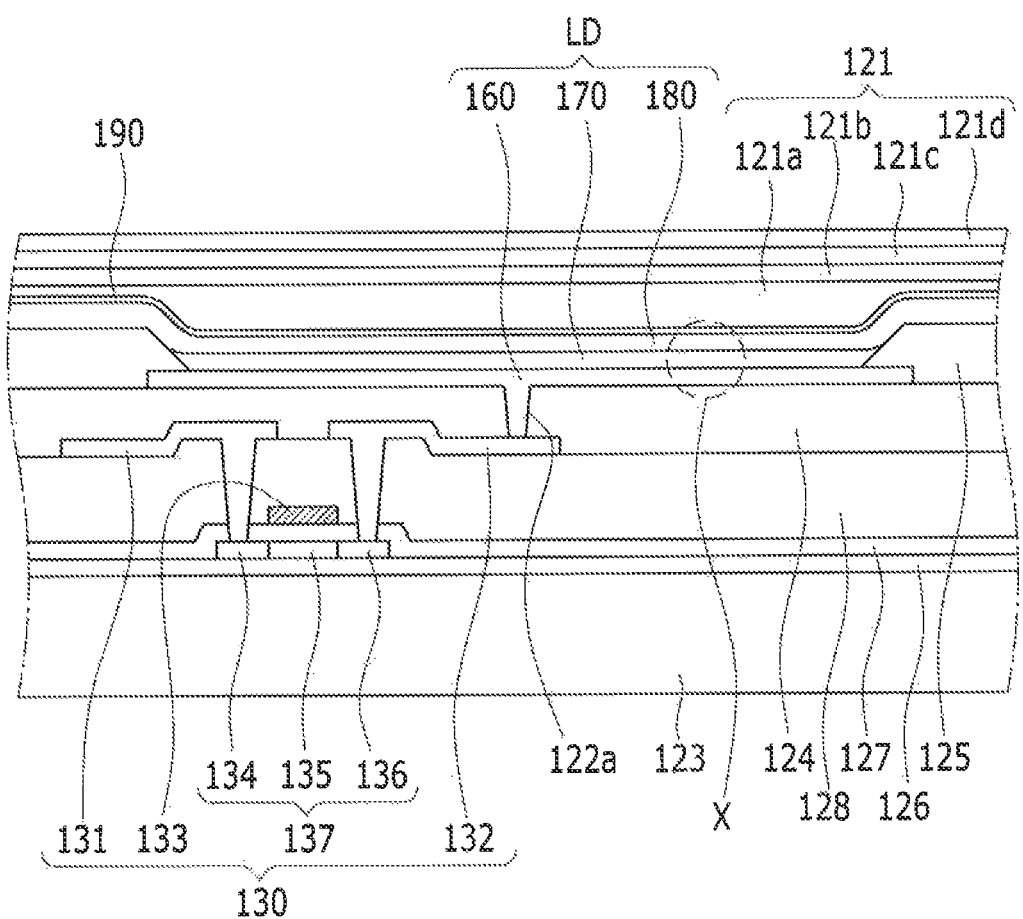
FIG. 1 is a cross-sectional view illustrating an organic light emitting diode (OLED) display according to an exemplary embodiment of the present invention.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. Like reference numerals may refer to the like elements throughout the specification and drawings.

Figure 2:
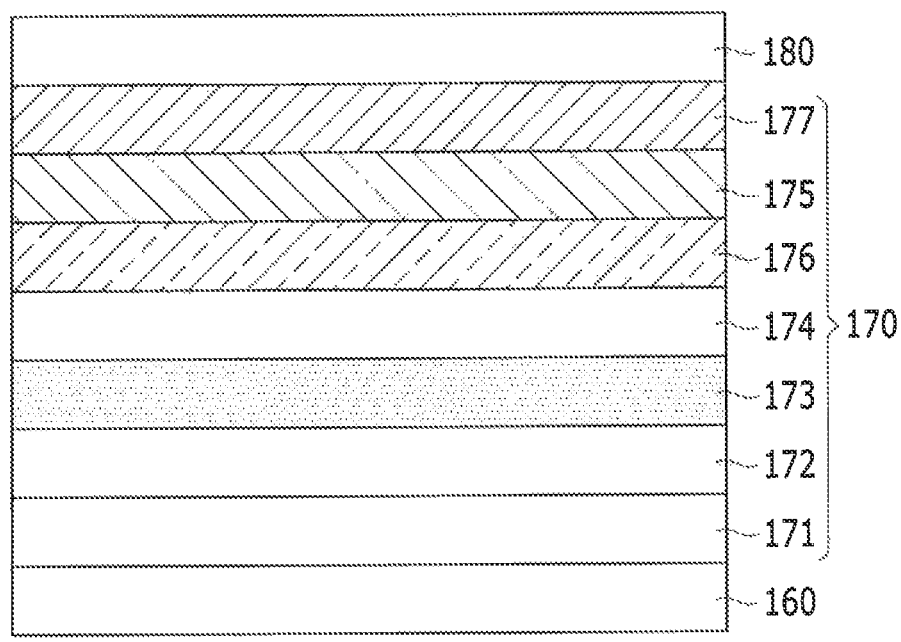
FIG. 2 is an enlarged cross-sectional view of an OLED display according to an exemplary embodiment of the present invention.

Hereinafter, the configuration of an organic light emitting diode (OLED) display according to an exemplary embodiment will be described with reference to FIGS. 1 and 2. FIG. 1 is a cross-sectional view illustrating an organic light emitting diode (OLED) display according to an exemplary embodiment of the present invention. FIG. 2 is an enlarged cross-sectional view of an OLED display according to an exemplary embodiment of the present invention. The configuration of the OLED display may prevent damage to an organic light emitting element due to a sputtering process, and thus increase its luminous efficiency.

The OLED display includes a substrate 123, a thin film transistor 130, a first (pixel) electrode 160, a hole injection layer (HIL) 171, a hole transport layer (HTL) 172, an emission layer 173, an electron transport layer (ETL) 174, a first buffer layer 177, a second buffer layer 175, a third buffer layer 176, and a second (common) electrode 180.

The substrate 123 may be formed of an insulating substrate made of glass, quartz, ceramic, plastic, and the like. However, the present invention is not limited thereto, and the substrate 123 may also be formed as a metallic substrate made of stainless steel and the like.

A buffer layer 126 is formed on the substrate 123. The buffer layer 126 serves to prevent penetration of impurity elements and planarize the surface of the substrate 123. The buffer layer 126 may be formed of various materials including, but is not limited to, silicon nitride ($SiN_x$), silicon oxide ($SiO_y$), or silicon oxynitride ($SiO_xN_y$). Alternatively, the buffer layer 126 may be omitted according to the type of the substrate 123 and the condition of a process performed on the substrate 123.

A driving semiconductor layer 137 is formed on the buffer layer 126. The driving semiconductor layer 137 may be formed of a polysilicon film. The driving semiconductor layer 137 includes a channel region 135, and a source region 134 and a drain region 136 which are doped and formed at opposite sides of the channel region 135. In this case, the doped impurities may be p-type impurities such as boron (B). For example, $B_2H_6$ may be used for doping boron into the source and drain regions 134 and 136. The doped impurities are not limited thereto, and may be various kinds of impurities according to the kind of a thin film transistor.

A gate insulating layer 127 may be formed of silicon nitride ($SiN_x$) or silicon oxide ($SiO_y$). The gate insulating layer 127 is formed on the driving semiconductor layer 137.

A driving gate electrode 133 is formed on the gate insulating layer 127. The driving gate electrode 133 overlaps at least the channel region 135 of the driving semiconductor layer 137.

An interlayer insulating layer 128 covers the driving gate electrode 133. The interlayer insulating layer 128 is formed on the gate insulating layer 127. Through holes H penetrates the interlayer insulating layer 128 and the gate insulating layer 127 to expose the source region 134 and the drain region 136. The interlayer insulating layer 128 may be formed of an insulating material such as silicon nitride ($SiN_x$), silicon oxide ($SiO_y$), or the like, similar to the gate insulating layer 127.

A data wire including a driving source electrode 131 and a driving drain electrode 132 is formed on the interlayer insulating layer 128. The driving source electrode 131 and the driving drain electrode 132 are respectively connected to the source region 134 and the drain region 136 of the driving semiconductor layer 137 via through holes H formed in the interlayer insulating layer 128 and the gate insulating layer 127.

The driving thin film transistor 130 including the driving semiconductor layer 137, the driving gate electrode 133, the driving source electrode 131, and the driving drain electrode 132 is formed. The configuration of the driving thin film transistor 130 is not limited thereto, and may be variously changed.

A planarization film 124 covering the data wire is formed on the interlayer insulating layer 128. The planarization layer 124 serves to planarize the interlayer insulating layer 128 to increase the light emitting efficiency of the organic light emitting element to be formed thereon. An electrode contact hole 122a penetrates the planarization layer 124 to expose a part of the drain electrode 132.

The planarization layer 124 may include, but is not limited to, polyacrylate resin, epoxy resin, phenolic resin, polyamide resin, polyimide resin, unsaturated polyesters resin, polyphenylenether resin, polyphenylene sulfide resin, or benzocyclobutene (BCB).

Alternatively, one of the planarization layer 124 and the interlayer insulating layer 128 may be omitted.

The pixel electrode 160 serving as a first electrode of the organic light emitting element is formed on the planarization layer 124. The OLED display includes a plurality of pixel electrodes 160. Each pixel electrode 160 is formed for a corresponding pixel of a plurality of pixels. Each pixel electrode 160 is spaced from each other. The pixel electrode 160 is connected to the drain electrode 132 through an electrode contact hole 122a.

A pixel defining layer 125 is formed on the planarization layer 124. The pixel defining layer 125 includes a plurality of openings. Each opening is formed for each pixel. An organic emission layer 170 is formed in the opening of the pixel defining layer 125. Accordingly, a pixel region including an organic emission layer is defined by the pixel defining layer 125.

The pixel defining layer 125 partially covers the pixel electrode 160 so that the opening of the pixel defining layer 125 exposes the pixel electrode. For example, the pixel electrode 160 is partially disposed beneath the pixel defining layer 125, and the pixel electrode 160 is partially overlapped by the pixel defining layer 125.

The pixel defining layer 125 may be formed of a resin such as polyacrylate resin, polyimide resin, or the like, or a silica-series inorganic material.

The organic emission layer 170 is formed on the pixel electrode 160. A detailed configuration of the organic emission layer 170 will be descried hereinafter.

A common electrode 180 serving as a second electrode of the organic light emitting element is formed on the organic emission layer 170. As such, an organic light emitting element LD including the pixel electrode 160, the organic emission layer 170, and the common electrode 180 is formed.

The pixel electrode 160 and the common electrode 180 may be formed of a transparent conductive material, or a semitransparent or reflective conductive material. The OLED display may be a top emission type, a bottom emission type, or a both-side emission type according the material of the pixel electrode 160 and the common electrode 180.

A cover film 190 covers the common electrode 180 to protect the common is electrode 180. The cover film 190 may be formed of an organic film.

A thin film encapsulation layer 121 is formed on the cover layer 190. The thin film encapsulation layer 121 seals and protects the organic light emitting element LD and a driving circuit portion formed on the substrate 123 from the outside.

The thin film encapsulation layer 121 includes a plurality of encapsulation films 121a to 121d stacked on each other. The encapsulation films 121a and 121c may be formed of an organic material. The encapsulation films 121b and 121d may be formed of an inorganic material. The structure of the thin film encapsulation layer 121 is not limited thereto, but it may be layered in various ways.

FIG. 2 is an enlarged cross-sectional view of an organic light emitting element according to an exemplary embodiment of the present invention. FIG. 2 shows an enlarged view of an organic light emitting element LD of FIG. 1.

Referring to FIG. 2, the organic light emitting element LD (portion X of FIG. 1) includes the first electrode 160, the hole injection layer 171, the hole transport layer 172, the emission layer 173, the electron transport layer 174, the third buffer layer 176, the second buffer layer 175, the first buffer layer 177, and the second electrode 180 that are stacked on each other.

The organic emission layer 170 of FIG. 1 includes the hole injection layer 171, the hole transport layer 172, the emission layer 173, the electron transport layer 174, the third buffer layer 176, the second buffer layer 175, and the first buffer layer 177.

The hole injection layer 171 is disposed on the first electrode 160. The hole injection layer 171 serves to inject holes from the first electrode 160 into the hole transport layer 172. The hole injection layer 171 may be formed of, but is not limited to, copper phthalocyanine (CuPc), poly(3,4-ethylenedioxythiophene) (PEDOT), polyaniline (PANI), or N,N'-diphenyl-N,N'-di-[4-(N,N-diphenyl-amino)phenyl]benzidine (NPNPB).

The thickness of the hole injection layer 171 may ranges from about 25 nm to so about 35 nm. For example, the thickness of the hole injection layer 171 may be about 30 nm.

The hole transport layer 172 is disposed on the hole injection layer 171. The hole transport layer 172 serves to transport the holes from the hole injection layer 171 to the emission layer 173. For example, the hole transport layer 172 may be formed of, but is not limited to, N,N-di(1-naphthyl)-N,N'-di(phenyl)benzidine (NPD), N,N'-bis(3-methylphenyl)-N,N'-bis(phenyl) (TPD), s-TAD, or 4,4',4"-tris(N-3-methylphenyl-N-phenyl-amino)-triphenylamine (MTDATA).

The thickness of the hole transport layer 172 may range about 15 nm to about 25 nm. For example, the thickness of the hole transport layer 172 may be about 20 nm.

In the present exemplary embodiment, the hole injection layer 171 and the hole transport layer 172 have been described to form the stacked structure, but the present invention is not limited thereto. Alternatively, the hole injection layer 171 and the hole transport layer 172 may be formed as a single layer.

The emission layer 173 contains a light emitting material for displaying a predetermined color. For example, the emission layer 173 may display a primary color such as blue, green, or red, or a combination thereof.

The thickness of the emission layer 173 may range from about 15 nm to about 25 nm. For example, the thickness of the emission layer 173 may be about 20 nm.

The emission layer 173 contains a host material and a dopant. The emission layer 173 may contain materials for emitting red, green, blue, and white light, and may be formed by using a phosphorescent or fluorescent material.

For red light, the emission layer 173 contains a host material having carbazole biphenyl (CBP) or 1,3-bis(carbazol-9-yl) (mCP), and may be formed of a phosphorescent material containing a dopant including, but is not limited to, PIQIr(acac) (bis(1-phenylisoquinoline)acetylacetonate iridium), PQIr(acac) (bis(1-phenylquinoline)acetylacetonate iridium), PQIr (tris(1-phenylquinoline)iridium), or PtOEP (platinum octaethylporphyrin), For green light, the emission layer 173 contains a host material having CBP or mCP, and may be formed of a phosphorescent material containing a dopant including Ir(ppy)3 (fac-tris(2-phenylpyridine)iridium) or a phosphorescent material containing a dopant having Alq3 (tris(8-hydroxyquinolino)aluminum), For blue light, the emission layer 173 contains a host material having CBP or mCP, and may be formed of a phosphorescent material containing a dopant (4,6-F2ppy)2lrpic. Alternatively, the emission layer 173 may be formed of a phosphorescent material including, but is not limited to, spiro-DPVBi, spiro-6P, distyryl benzene (DSB), distyryl arylene (DSA), a PFO-based polymer, or a PPV-based polymer.

The electron transport layer 174 is disposed on the emission layer 173. The electron transport layer 174 serves to transfer electrons from the second electrode 180 to the emission layer 173. Further, the electron transport layer 174 serves to prevent the holes injected from the first electrode 160 from moving to the second electrode 180 through the emission layer 173. For example, the electron transport layer 174 serves as a hole blocking layer to improve combination of the holes and electrons in the emission layer 173.

The electron transport layer 174 may be formed of, but is not limited to, Alq3 (tris(8-hydroxyquinolino)aluminum), PBD, TAZ, spiro-PBD, BAlq, or SAlq.

The third buffer layer 176 is disposed on the electron transport layer (ETL) 174.

The third buffer layer 176 serves to inject electrons from the second buffer layer 175 into the ETL 174. The third buffer layer 176 may be formed of, but is not limited to, LiF, Yb, $WO_3$, $MoO_x$, Liq, or Mg. Herein, the $MoO_x$ indicates a molybdenum oxide.

The thickness of the third buffer layer 176 may range from about 1 nm to about 3 nm. For example, the thickness of the third buffer layer 176 may be about 2 nm.

The second buffer layer 175 is disposed on the third buffer layer 176. The third buffer layer 176 is disposed between the second buffer layer 175 and the ETL 174.

The second buffer layer 175 facilitates smooth movement of the electrons transferred from the second electrode 180 to a layer having higher electron mobility. The second buffer layer 175 may be formed of, but is not limited to, copper phthalocyanine (CuPc), copper hexadecafluorophthalocyanine ($F_{16}$CuPc), molybdenum oxide ($MoO_x$), tungsten trioxide ($WO_3$), or HAT-CN. Alternatively, the second buffer layer 175 may be formed of a polycrystalline organic or inorganic material having high electron mobility.

The thickness of the second buffer layer 175 may range from about 85 nm to about 95 nm. For example, the thickness of the second buffer layer 175 may be about 90 nm to increase the luminous efficiency of the OLED display. For example, the luminous efficiency of the OLED display may be maximized at such thickness. The luminous efficiency of the OLED display according to an exemplary embodiment will be described hereinafter.

The second buffer layer 175 serves to prevent damage to the emission layer 173 from occurring from a sputtering process for forming the common electrode 180.

The first buffer layer 177 is disposed between the second buffer layer 175 and the second electrode 180.

The first buffer layer 177 facilitates easy injection of electrons from the second electrode 180 into the first buffer layer 450. The first buffer layer 177 may be formed of, but is not limited to, lithium fluoride (LIF) Yb, $WO_3$, $MoO_x$, Liq, or Mg. Herein, the $MoO_x$, indicates various molybdenum oxides.

Figure 3:
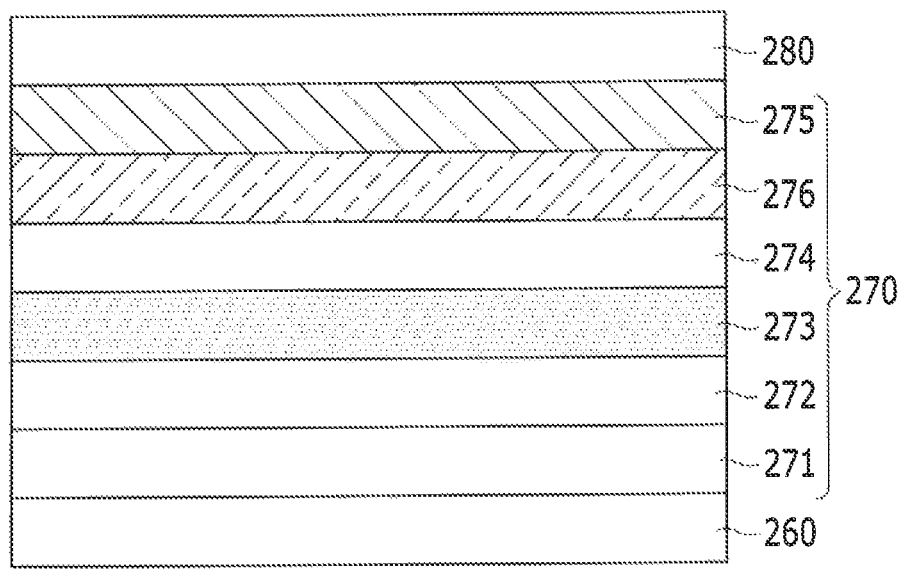
FIG. 3 is an enlarged cross-sectional view of an OLED display according to an exemplary embodiment of the present invention.

The thickness of the first buffer layer 177 may range from about 1 nm to about 3 nm. For example, the thickness of the third buffer layer 177 may be about 2 nm. Alternatively, the thickness of the third buffer layer 177 may be about 1.5 nm FIG. 3 is an enlarged cross-sectional view of an organic light emitting element according to an exemplary embodiment of the present invention. FIG. 3 shows an enlarged view of an organic light emitting element LD (portion X) of FIG. 1. The organic light emitting element LD of FIG. 3 is substantially similar to that of FIG. 2. except that the first buffer layer 177 of FIG. 2 is omitted. Hereinafter, differences will be described in detail, and the description of the same elements will be omitted.

Referring to FIG. 3, the organic light emitting element LD of FIG. 3 includes a third buffer layer 276, a second buffer layer 275, and a third electrode 280 that are sequentially stacked on an electron transport layer 274.

The third buffer layer 276 facilitates easy injection of electrons from the second buffer layer 275 into the electron transport layer 274. The third buffer layer 276 may be formed of, but is not limited to, LiF, Yb, $WO_3$, $MoO_x$, Liq, or Mg. Herein, the $MoO_x$ indicates a molybdenum oxide.

The thickness of the third buffer layer 276 may range from about 1 nm to about 3 nm. For example, the thickness of the third buffer layer 276 may be about 2 nm.

The second buffer layer 275 facilitates smooth movement of the electrons transferred from the second electrode 280 to a layer having higher electron mobility. The second buffer layer 275 may be formed of, but is not limited, copper phthalocyanine (CuPc), copper hexadecafluorophthalocyanine ($F_{16}$CuPc), molybdenum oxide ($MoO_x$), tungsten trioxide ($WO_3$), or HAT-CN. Alternatively, the second buffer layer 275 may be formed of a polycrystalline organic or inorganic material having high electron mobility.

The thickness of the second buffer layer 275 may range from about 85 nm to about 95 nm. For example, the thickness of the second buffer layer 275 may be about 90 nm.

Figure 4:
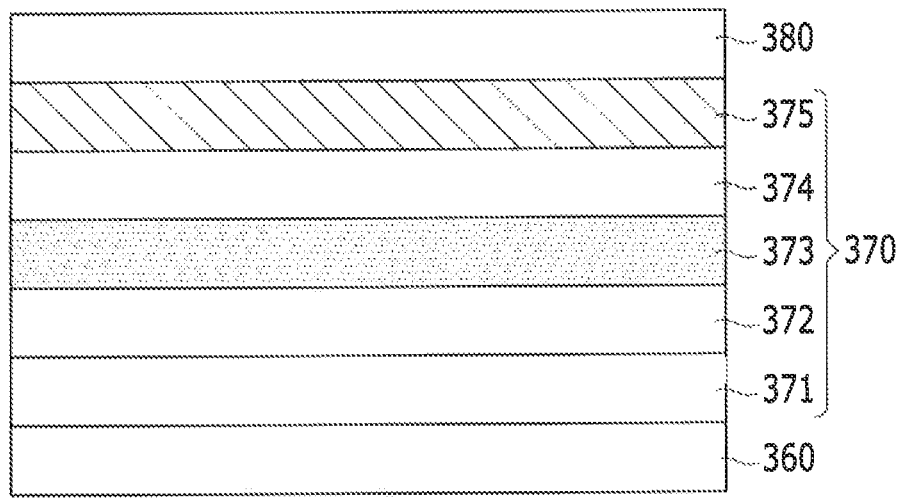
FIG. 4 is an enlarged cross-sectional view of an OLED display according to an exemplary embodiment of the present invention.

FIG. 4 is an enlarged cross-sectional view of an organic light emitting element according to an exemplary embodiment of the present invention. FIG. 4 shows an enlarged view of an organic light emitting element LD (portion X) of FIG. 1. The organic light emitting element LD of FIG. 4 is substantially similar to that of FIG. 2, except that the third and first buffer layers 176 and 177 of FIG. 2 are omitted. Hereinafter, differences will be described in detail, and the description of the same elements will be omitted.

Referring to FIG. 4, the organic light emitting element LD includes a second buffer layer 375 and a second electrode 380 that are sequentially stacked on an electron transport layer 374.

The second buffer layer 375 facilitates smooth movement of the electrons, transferred from the second electrode 380, to a layer having higher electron mobility. The second buffer layer 375 may be formed of, but is not limited to, copper phthalocyanine (CuPc), copper hexadecafluorophthalocyanine ($F_{16}CuPc$), molybdenum oxide ($MoO_x$), tungsten trioxide ($WO_3$), or HAT-CN. Alternatively, the second buffer layer 375 may be formed of a polycrystalline organic or inorganic material having high electron mobility.

The thickness of the second buffer layer 375 may range from about 85 nm to about 95 nm. For example, the thickness of the second buffer layer 375 may be about 90 nm.

Figure 5:
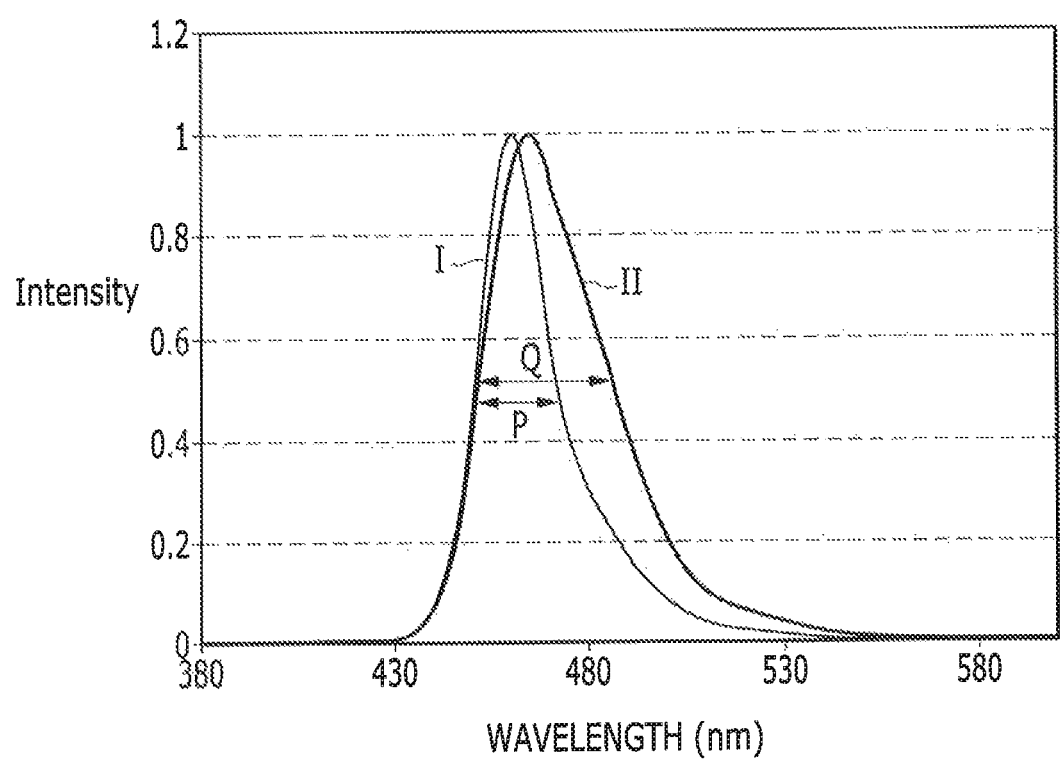
FIG. 5 and FIG. 6 are graphs illustrating light intensity and luminous efficiency of the OLED display according to an exemplary embodiment of the present invention.
Figure 6:
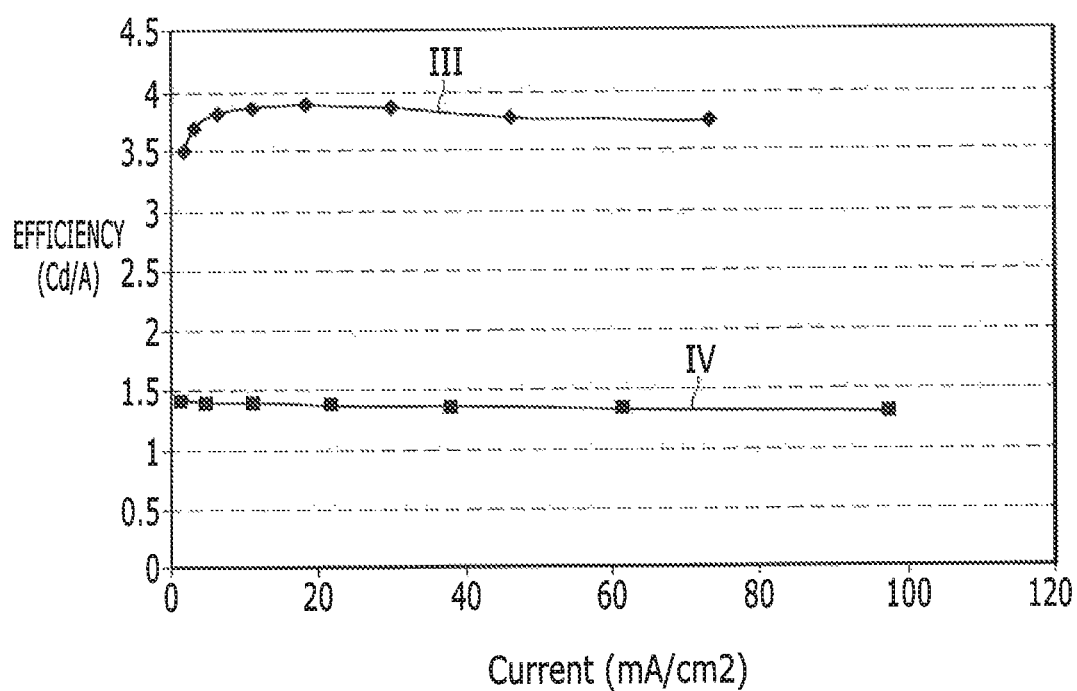

FIG. 5 and FIG. 6 are graphs illustrating light intensity and luminous efficiency of the OLED display according to an exemplary embodiment of the present invention.

The measuring results I and III represent light intensity and luminous efficiency, respectively, of an experimental sample according to an exemplary embodiment. The experimental sample includes an organic light emitting element, where the hole injection layer has a thickness of about 30 nm, the hole transport layer has a thickness of about 20 nm, the emission layer has a thickness of about 20 nm, the electron transport layer has a thickness of 30 nm, the third buffer layer has a thickness of 2 nm, the second buffer layer has a thickness of 90 nm, and the first buffer layer has a thickness of 2 nm. The first buffer layer, the second buffer layer, and the third buffer layer are respectively made of Yb+LiF, $MoO_x$, and Yb+LiF. The hole injection layer, the hole transport layer, the emission layer, the electron transport layer are respectively made of DNTPD, NPB, (MADN, BCzVBi), and Alq3.

The measuring results II and IV represents light intensity and luminous efficiency of a comparative sample of a conventional OLED display in which the hole injection layer has a thickness of about 10 nm, the hole transport layer has a thickness of about 130 nm, the emission layer has a thickness of about 20 nm, the electron transport layer has a thickness of about 30 nm, and the electron injection layer (EIL) has a thickness of 1 nm. The hole injection layer, the hole transport layer, the emission layer, the electron transport layer, and the EIL are respectively made of DNTPD, NPB, (MADN, BCzVBi), Alq3, and LiF.

Referring to FIG. 5, the measuring result I for the experimental sample has a maximum intensity at the wavelength of 460 nm and a width P of the maximum wavelength (460 nm)(at an intensity 0.5). The measuring result II for the comparative sample has a maximum intensity at the wavelength of 480 nm and has a width Q(at an intensity 0.5). The width P is smaller than the width Q. Accordingly, the experimental sample emits light whose wavelengths are more concentrated at a specific wavelength of a specific color than the comparative sample. For example, the OLED display according to an exemplary embodiment emits light having a specific wavelength. As a result, the OLED display has an increased image quality.

Referring to FIG. 6, the luminous efficiency III for the experimental sample has higher than the luminous efficiency IV for the comparative sample.

According to an exemplary embodiment, an OLED display has significantly higher luminous efficiency than that of the conventional OLED display, and may prevent damage to an organic light emitting element from occurring due to a sputtering process using multi-layered buffer layers located on an electron transport layer.

Figure 7:
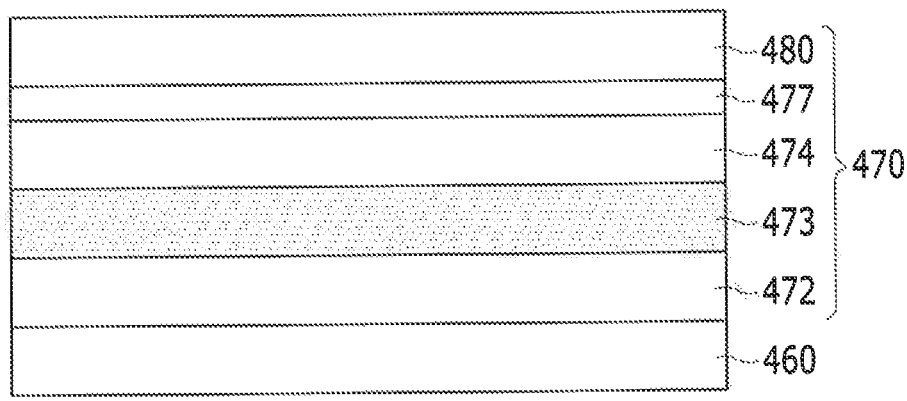
FIG. 7 is an enlarged cross-sectional view of an OLED display according to an exemplary embodiment of the present invention.

FIG. 7 is an enlarged cross-sectional view of an OLED display according to an exemplary embodiment of the present invention, FIG. 7 shows an enlarged view of an organic light emitting element LD (portion X) of FIG. 1. The organic light emitting element LD of FIG. 7 is substantially similar to that of FIG. 2, except that the second buffer layer and the third buffer layer of FIG. 2 are omitted. Hereinafter, differences will be described in detail, and the description of the same elements will be omitted.

Referring to FIG. 7, the organic light emitting element LD of FIG. 7 includes a first buffer layer 477 and a second electrode 480 that are sequentially stacked on an electron transport layer 474. Further, the hole injection layer and the hole transport layer are formed as a single unit, unlike in the organic light emitting element LD of FIG. 2.

The first buffer layer 477 facilitates easy injection of electrons from the second electrode 480 into the electron transport layer 474. The first buffer layer 477 may be formed of, but is not limited to, LiF, Yb, $WO_3$, $MoO_x$, Liq, or Mg. Herein, the $MoO_x$ indicates a molybdenum oxide.

The thickness of the first buffer layer 477 may range from about 1 nm to about 3 nm. For example, the thickness of the first buffer layer 477 may be about 2 nm. Alternatively, the thickness of the first buffer layer 477 may be about 1.5 nm.

The hole injection layer and the hole transport layer described in FIG. 2 may be formed as a single unit in FIG. 7. Referring to FIG. 7, a first auxiliary layer 472, an emission layer 473, the electron transport layer 474, the first buffer layer 477, and the second electrode 480 are sequentially stacked on a first electrode 460. The first auxiliary 472 may be formed of, but is not limited thereto, CuPc (cupper phthalocyanine), PEDOT(poly(3,4)-ethylenedioxythiophene), PANI (polyaniline), NPD (N,N-dinaphthyl-N,N'-diphenyl benzidine), NPD (N,N-dinaphthyl-N,N'-diphenyl benzidine), TPD (N,N'-bis-(3-methylphenyl)-N,N'-bis-(phenyl)-benzidine), s-TAD, or MTDATA (4,4',4"-Tris(N-3-methylphenyl-N-phenyl-amino)-triphenylamine).

Figure 8:
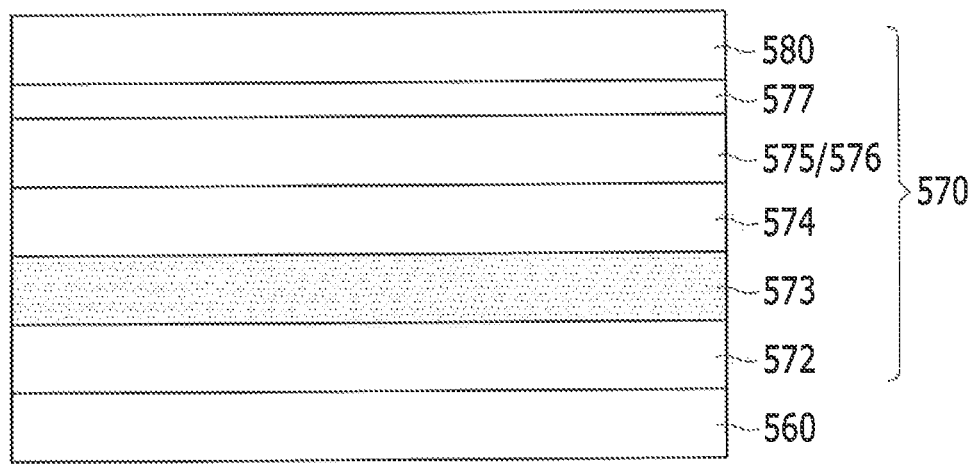
FIG. 8 is an enlarged cross-sectional view of an OLED display according to an exemplary embodiment of the present invention.

The thickness of the first auxiliary layer 472 may be about 110 nm,

FIG. 8 is an enlarged cross-sectional view of an OLED display according to an exemplary embodiment of the present invention. FIG. 8 shows an enlarged view of an organic light emitting element LD (portion X) of FIG. 7. The organic light emitting element LD of FIG. 8 is substantially similar to that of FIG. 7, except that the second buffer layer or the third buffer layer of FIG. 7 is added. Hereinafter, differences will be described in detail, and the description of the same elements will be omitted.

Referring to FIG. 8, the organic light emitting element LD of FIG. 8 includes a second buffer layer 575 or a third buffer layer 576, a first buffer layer 577, and a second electrode 580 that are sequentially stacked on an electron transport layer 574.

The first buffer layer 577 facilitates easy injection of electrons from the second electrode 580 into the electron transport layer 574. The first buffer layer 577 may be formed of, but is not limited to, LiF, Yb, WO3, MoOx, Liq, or Mg. Herein, the MoOx indicates a molybdenum oxide.

The thickness of the first buffer layer 577 may range from about 1 nm to about 3 nm. For example, the thickness of the first buffer layer 577 may be about 2 nm. Alternatively, the thickness of the first buffer layer 577 may be about 1.5 nm.

Referring to FIG. 8, the second buffer layer 575 or the third buffer layer 576 is disposed between the first buffer layer 577 and the hole transport layer 574, The second buffer layer 575 facilitates smooth movement of the electrons transferred from the first buffer layer 577 to a layer having higher electron mobility. The second buffer layer 575 may be formed of, but is not limited to, copper phthalocyanine (CuPc), copper hexadecafluorophthalocyanine (F16CuPc), molybdenum oxide ($MoO_x$), or tungsten trioxide ($WO_3$). Alternatively, the second buffer layer 575 may be formed of a polycrystalline organic or inorganic material having high electron mobility.

The thickness of the second buffer layer 575 may range from about 85 nm to about 95 nm. For example, the thickness of the second buffer layer 575 may be about 90 nm.

According to an exemplary embodiment, the third buffer layer 576 may be disposed between the first buffer layer 577 and the electron transport layer 574, instead of the second buffer layer 575.

The third buffer layer 576 facilitates easy injection of electrons from the first buffer layer 577 into the electron transport layer 574. The third buffer layer 576 may be formed of, but is not limited to, LiF, Yb, $WO_3$, $MoO_x$, Liq, or Mg. Herein, the $MoO_x$ indicates a molybdenum oxide.

The thickness of the third buffer layer 576 may range from about 1 nm to about 3 nm. For example, the thickness of the third buffer layer 576 may be about 2 nm.

Figure 9:
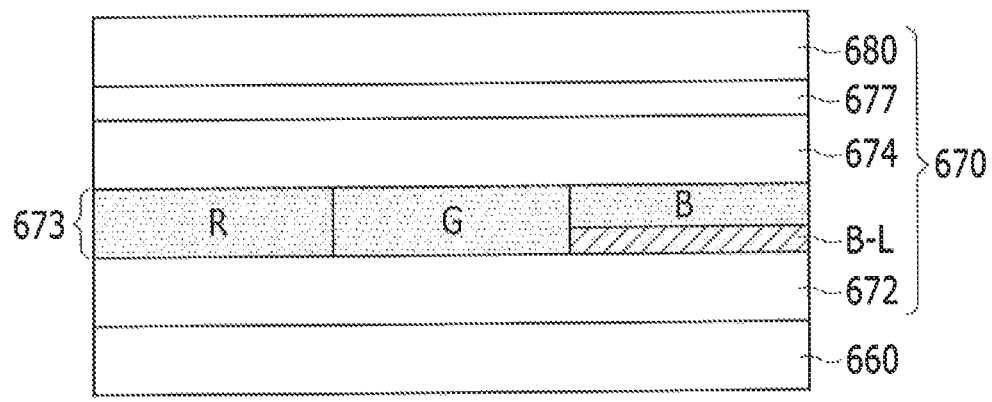
FIG. 9 is an enlarged cross-sectional view of an OLED display according to an exemplary embodiment of the present invention.

FIG. 9 is an enlarged cross-sectional view of an OLED display according to an exemplary embodiment of the present invention. FIG. 9 shows an enlarged view of an organic light emitting element LD (portion X) of FIG. 7. The organic light emitting element LD of FIG. 9 is substantially similar to that of FIG. 7, except for an emitting layer, which is modified. An emitting layer 673 may include a red light emitting R, a green light emitting layer G, a blue light emitting layer B, and an auxiliary layer B-L for increasing the blue light emitting layer B disposed at a lower end.

The thickness of the red light emitting layer R may range from about 30 nm to about 50 nm, the thickness of the green light emitting layer G may range from about 10 nm to about 30 nm, and thickness of the blue light emitting layer B may range from about 10 nm to about 30 nm. The thickness of the auxiliary layer B-L may be less than about 20 nm. The auxiliary layer B-L may serve to adjust a hole charge balance to improve an efficiency of the blue light emitting layer B. The auxiliary layer B-L may contain a compound that is represented by the following chemical formula 1.

In Chemical formula 1, each of "A1" "A2" and "A3" may be an alkyl group, an aryl group, carbazole, dibenzothiophene, dibenzofuran (DBF), or biphenyl, and each of "a," "b," and "c" may be an integer ranging from 0 to 4.

Examples of compounds represented by Chemical formula 1 may include the following chemical formulae 1-1, 1-2, 1-3, 1-4, 1-5, and 1-6.

[Chemical formula 1]

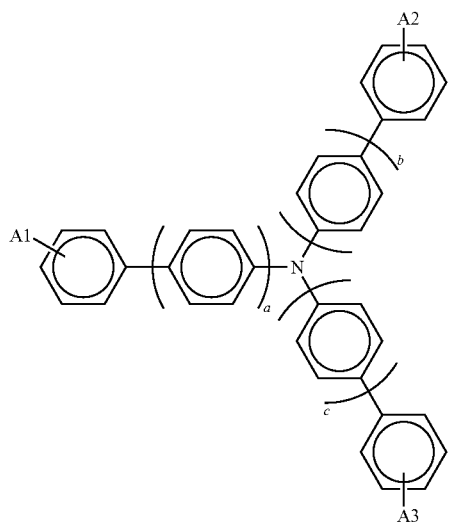

[Chemical formula 1-1]

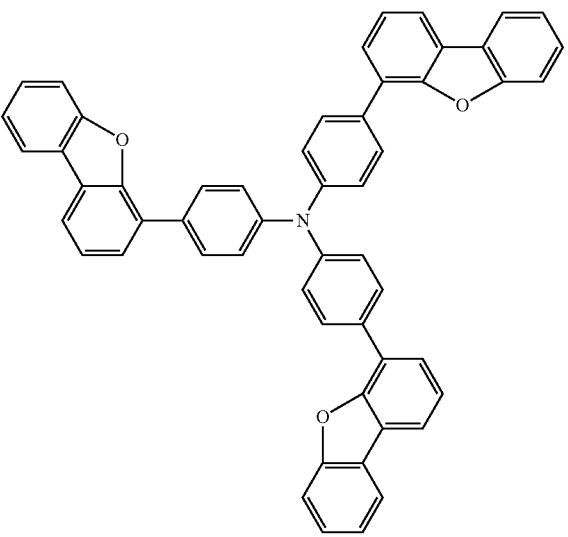

[Chemical formula 1-2]

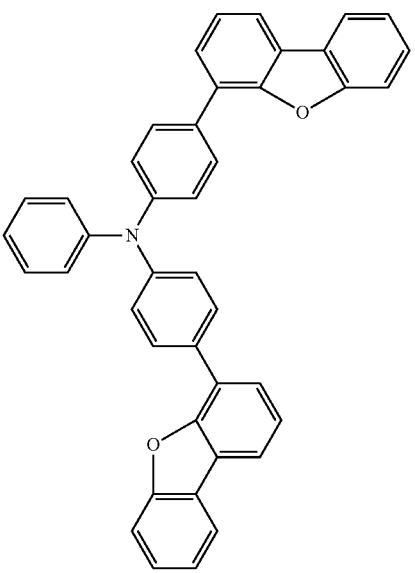

[Chemical formula 1-3]

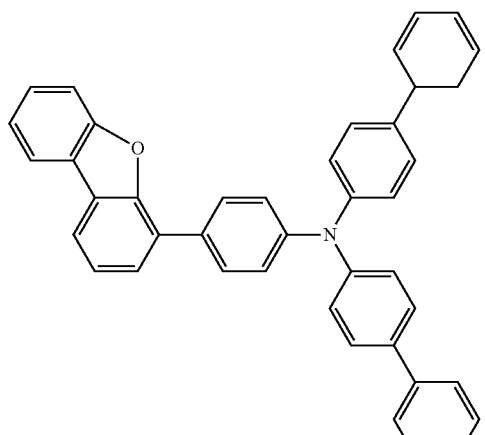

[Chemical formula 1-4]

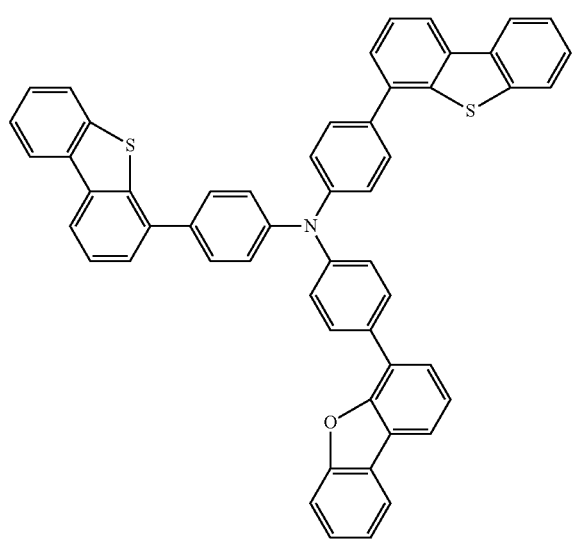

[Chemical formula 1-5]

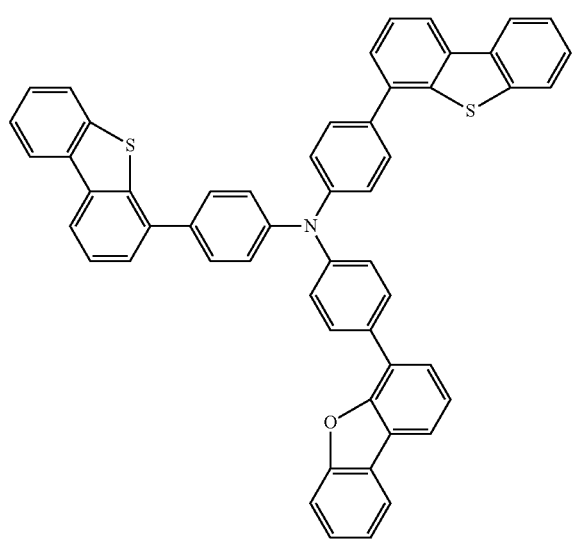

[Chemical formula 1-6]

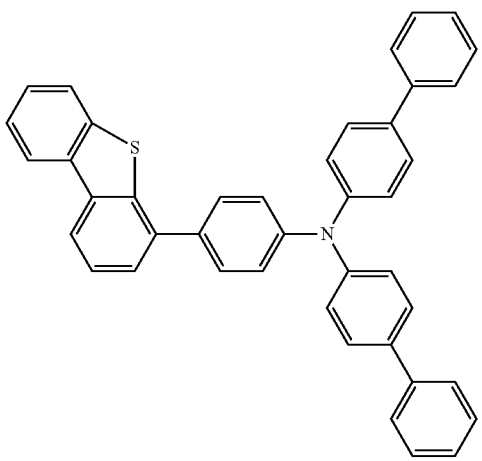

According to an exemplary embodiment, the auxiliary layer B-L may contain a compound that is represented by the following chemical formula 2.

[Chemical formula 2]

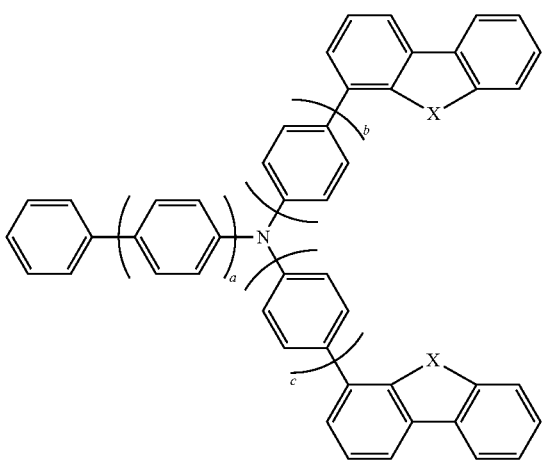

In Chemical formula 2, each of "a," "b," and "c" may be an integer ranging from 0 to 3, "X" may be one selected from among "O," "N," and "S," and the elements selected for X may be the same as or different from each other.

Examples of compounds represented by Chemical formula 2 may include the following chemical formulae 2-1, 2-2, 2-3, 2-4, 2-5, and 2-6.

[Chemical formula 2-1]
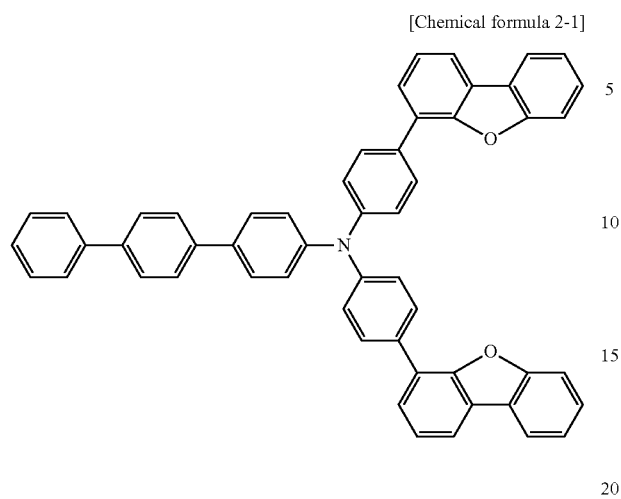
[Chemical formula 2-2]
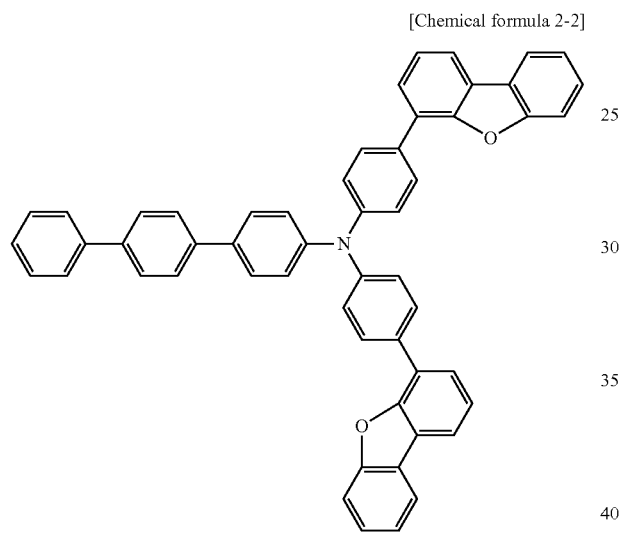
[Chemical formula 2-3]
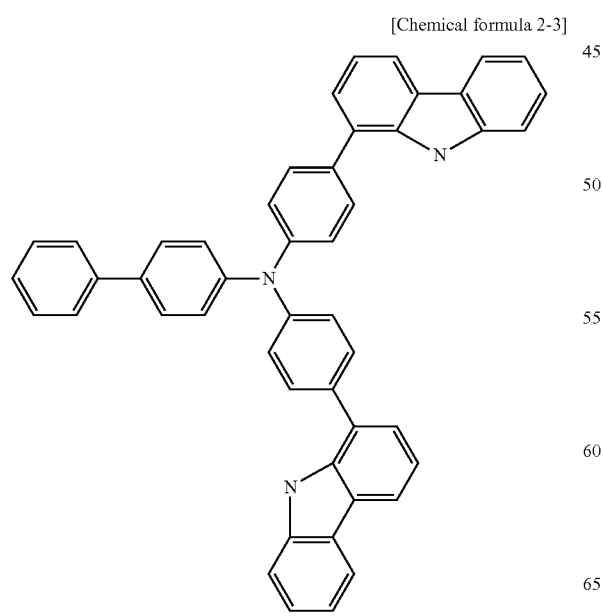
[Chemical formula 2-4]
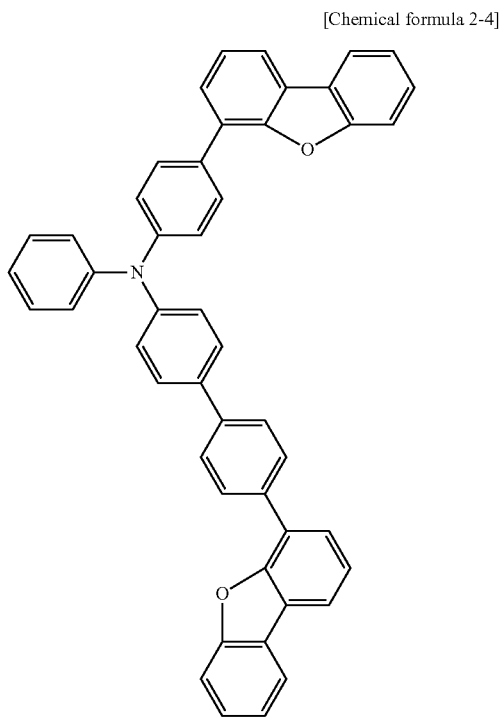 [SMILES: c1ccc(N(c2ccc(-c3ccc(-c4cccc5c4sc4ccccc45)cc3)cc2)c2ccc(-c3cccc4c3sc3ccccc34)cc2)cc1]
[Chemical formula 2-5]
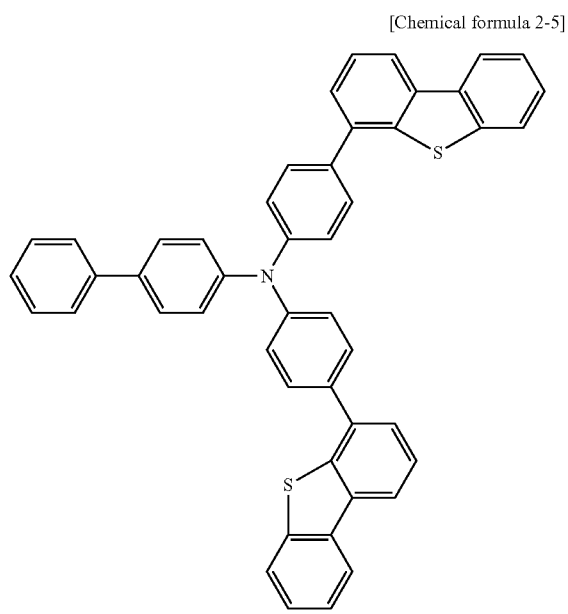

[Chemical formula 2-6]

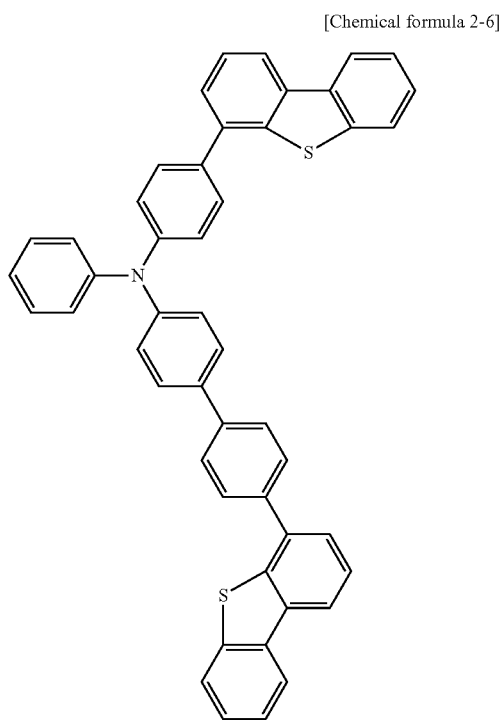

According to an exemplary embodiment, the auxiliary layer B-L may contain a compound that is represented by the following chemical formula 3.

[Chemical Formula 3]

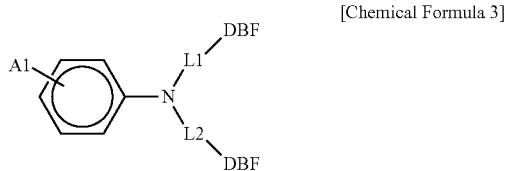

In Chemical formula 3, "A1" may be an alkyl group, an aryl group, carbazole, dibenzothiophene, or dibenzofuran (DBF), and each of L1 and L2 may be

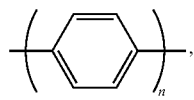

n being an integral ranging from 0 to 3. The DBF connected to L1 and L2 may be substituted with carbazole or dibenzothiophene.

Hereinafter, a synthesis method of the auxiliary layer B-L according to an exemplary embodiment will be described. As one example, the synthesis method of the Chemical formula 1-1 will be described.

[Chemical formula 1-1]

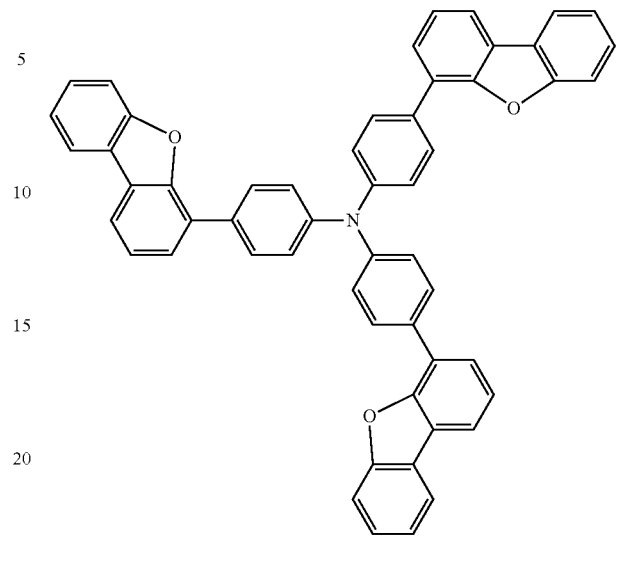

SYNTHESIS EXAMPLE

Under an argon atmosphere, 4-dibenzofuranboronic acid of 6.3 g; 4,4', 4"-Tribromotriphenylamine of 4.8 g; tetrakis (phenylphosphine)palladium(Pd(PPh3)4) of 104 mg; 2M solution of sodium carbonate ($Na_2CO_3$) 48 ml; and toluene of 48 ml were put into a three-neck flask of 300 ml, and then they were reacted at a temperature of 80° C. for 8 hours. The reaction liquid was extracted by using toluene/water, and the extract was dried by using sodium sulfate anhydride. This was concentrated under reduced pressurere, and a crude product obtained was refined through a column purifying process, thereby 3.9 g of a whitish yellow powder was obtained.

Referring to FIG. 9, the red light emitting layer R and the green light emitting layer G may be formed as a single unit, while the blue light emitting layer B and the auxiliary layer B-L may be formed as a dual layer.

Although not shown in FIG. 9, an auxiliary layer may be formed at lower ends of the red light emitting layer R and the green light emitting layer G.

The detailed descriptions related to the organic light emitting element LD of FIG. 7 except the above differences are applicable to the organic light emitting element LED of FIG. 9.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. An organic light emitting diode (OLED) display comprising:
   a substrate;
   a thin film transistor disposed on the substrate;
   a first electrode disposed on the thin film transistor and electrically connected to the thin film transistor;
   a second electrode facing the first electrode;
   an emission layer disposed between the first electrode and the second electrode;
   a first auxiliary layer disposed between the first electrode and the emission layer;

an electron transport layer disposed between the emission layer and the second electrode;

a first buffer layer disposed between the electron transport layer and the second electrode, wherein the first buffer layer comprises at least one selected from the group consisting of LiF, Yb, WO$_3$, MoO$_x$, Liq and Mg, wherein the emission layer comprises a red light emitting layer, a green light emitting layer, and a blue light emitting layer, wherein the emission layer further comprises a second auxiliary layer disposed at a lower end of the blue light emitting layer, and wherein each of the red light emitting layer and the green light emitting layer is non-overlapped with the second auxiliary layer in a thickness direction of the organic light emitting diode display.

2. The organic light emitting diode display of claim 1, further comprising a second buffer layer disposed between the electron transport layer and the first buffer layer.

3. The organic light emitting diode display of claim 2, further comprising a third buffer layer disposed between the second buffer layer and the electron transport layer.

4. The organic light emitting diode display of claim 3, wherein the second buffer layer comprises at least one of CuPc, F16CuPc, MoO$_x$, or WO$_3$.

5. The organic light emitting diode display of claim 3, wherein the third buffer layer comprises at least one of LiF, Yb, WO$_3$, MoO$_x$, Liq, or Mg.

6. The organic light emitting diode display of claim 1, wherein a thickness of the emission layer ranges from about 10 nm to about 50 nm.

7. The organic light emitting diode display of claim 6, wherein the first auxiliary layer comprises a hole injection layer and a hole transport layer disposed on the hole injection layer, and a thickness of the hole injection layer ranges from about 25 nm to about 35 nm, and a thickness of the hole transport layer ranges from about 15 nm to about 25 nm.

8. The organic light emitting diode display of claim 1, wherein a thickness of the first buffer layer ranges from about 1 nm to about 3 nm.

9. The organic light emitting diode display of claim 2, wherein a thickness of the second buffer layer ranges from about 85 nm to about 95 nm.

10. The organic light emitting diode display of claim 3, wherein a thickness of the third buffer layer ranges from about 1 nm to about 3 nm.

11. The organic light emitting diode display of claim 1, wherein the blue light emitting layer and the auxiliary layer are formed of a dual layer.

12. The organic light emitting diode display of claim 1, wherein the second auxiliary layer comprises a compound represented by the following chemical formula:

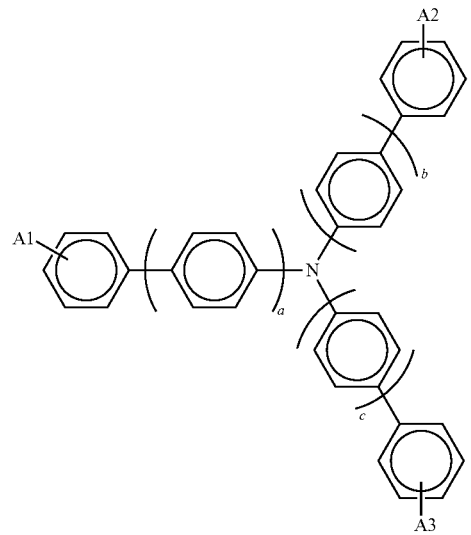

where each of "A1," "A2," and "A3" may be an alkyl group, an aryl group, carbazole, dibenzothiophene, dibenzofuran (DBF), or biphenyl, and each of "a," "b," and "c" may be an integer ranging from 0 and 4.

13. The organic light emitting diode display of claim 1, wherein the second auxiliary layer comprises a compound represented by the following chemical formula:

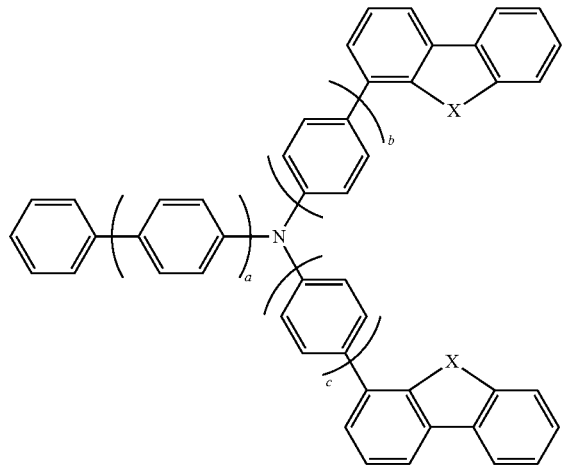

where each of "a," "b," and "c" may be an integer ranging from 0 to 3, "X" may be one selected from among "0," "N," and "S," and the elements selected for X may be the same as or different from each other.

* * * * *